US010664781B2

(12) United States Patent
Pettersson et al.

(10) Patent No.: US 10,664,781 B2
(45) Date of Patent: May 26, 2020

(54) CONSTRUCTION MANAGEMENT SYSTEM AND METHOD FOR LINKING DATA TO A BUILDING INFORMATION MODEL

(71) Applicant: HEXAGON TECHNOLOGY CENTER GMBH, Heerbrugg (CH)

(72) Inventors: Bo Pettersson, Luxembourg (LU); Håkan Andersson, Karlskoga (SE); Jonas Wedin, Karlskoga (SE)

(73) Assignee: HEXAGON TECHNOLOGY CENTER GMBH, Heerbrugg (CH)

(*) Notice: Subject to any disclaimer, the term of this patent is extended or adjusted under 35 U.S.C. 154(b) by 508 days.

(21) Appl. No.: 15/466,701

(22) Filed: Mar. 22, 2017

(65) Prior Publication Data
US 2017/0278037 A1 Sep. 28, 2017

(30) Foreign Application Priority Data
Mar. 22, 2016 (EP) .................................... 16161760

(51) Int. Cl.
*G06Q 50/08* (2012.01)
*G06Q 10/06* (2012.01)
*G06F 30/13* (2020.01)

(52) U.S. Cl.
CPC ....... *G06Q 10/06313* (2013.01); *G06F 30/13* (2020.01); *G06Q 50/08* (2013.01)

(58) Field of Classification Search
CPC ......... G06Q 10/00; G06Q 40/00; G06Q 40/06
(Continued)

(56) References Cited

U.S. PATENT DOCUMENTS 10,296,665 B2 * 5/2019 Buzz ................... G06F 17/5004
2005/0171790 A1 8/2005 Blackmon
(Continued)

FOREIGN PATENT DOCUMENTS

CN 103886139 A 6/2014
CN 104765905 A 7/2015
(Continued)

OTHER PUBLICATIONS

Pascal et al "Procedural Modeling of Buildings", Dec. 2006, ACM, pp. 614-623 (Year: 1220).*
(Continued)

*Primary Examiner* — Romain Jeanty
(74) *Attorney, Agent, or Firm* — Maschoff Brennan

(57) ABSTRACT

The invention pertains to a construction management system for the construction of a structure, comprising a plurality of sensor means adapted to detect events at a building site of the structure, a central computing unit providing a three-dimensional model of the building site, and at least one displaying device that is adapted to display the three-dimensional model to a user, wherein the sensor means is adapted for generating data comprising information about a detected event, the system comprises communication units adapted to transmit a message comprising the data and a location information to the central computing unit, assign coordinates in the three-dimensional model according to the location information, evaluate options for reacting on the event by analysing the data, assign evaluated options to the data, and display a note which is related to evaluated options to the user in real-time at the assigned coordinates in the three-dimensional model.

14 Claims, 10 Drawing Sheets

(58) Field of Classification Search
USPC .................................................... 705/7.23
See application file for complete search history.

(56) References Cited

U.S. PATENT DOCUMENTS

| | | | |
|---|---|---|---|
| 2008/0162004 A1* | 7/2008 | Price .................. | E02F 3/434 |
| | | | 701/50 |
| 2009/0210277 A1 | 8/2009 | Hardin et al. | |
| 2013/0155058 A1* | 6/2013 | Golparvar-Fard .... | G06T 19/006 |
| | | | 345/419 |
| 2014/0095119 A1 | 4/2014 | Lee et al. | |
| 2014/0192159 A1 | 7/2014 | Chen et al. | |
| 2014/0229335 A1 | 8/2014 | Chen | |
| 2014/0268064 A1 | 9/2014 | Kahle et al. | |
| 2014/0316837 A1* | 10/2014 | Fosburgh ......... | G06Q 10/06312 |
| | | | 705/7.22 |

FOREIGN PATENT DOCUMENTS

| | | | |
|---|---|---|---|
| CN | 104794331 | A | 7/2015 |
| CN | 105210103 | A | 12/2015 |
| CN | 105240051 | A | 1/2016 |
| CN | 105389931 | A | 3/2016 |
| EP | 2 629 210 | A1 | 8/2013 |
| GB | 2461647 | A | 1/2010 |
| JP | H11-311023 | A | 11/1999 |
| JP | 2005-173698 | A | 6/2005 |
| JP | 2010-266202 | A | 11/2010 |
| JP | 5489310 | B1 | 5/2014 |
| KR | 10-1354688 | B1 | 1/2014 |
| KR | 10-2014-0108465 | A | 9/2014 |
| WO | 90/01763 | A1 | 2/1990 |
| WO | 2013/056395 | A1 | 4/2013 |

OTHER PUBLICATIONS

Catherine "New 3-D computer models improve building design and construction", Jun. 2011, News Releases, pp. 1-4 (Year: 2011).*
EP Search Report dated Apr. 27, 2016 as received in Application No. 16161760.0.

* cited by examiner

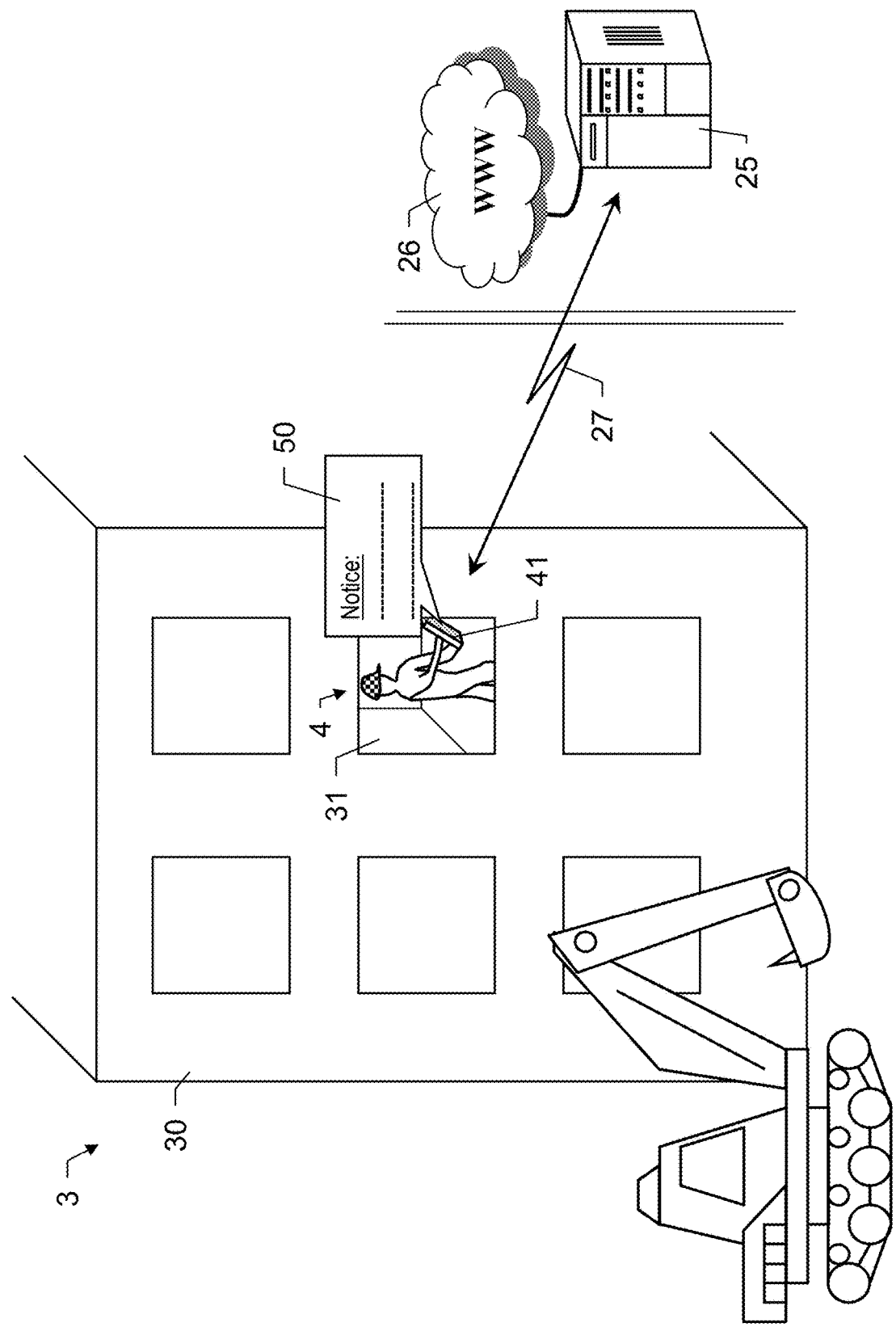

CONSTRUCTION MANAGEMENT SYSTEM AND METHOD FOR LINKING DATA TO A BUILDING INFORMATION MODEL

FIELD OF THE INVENTION

The present invention pertains to a construction management system for a building site of a structure, and to a method for linking data to a three-dimensional model of the building site or of the structure. The data comprises information about an event occurring at the building site. Particularly, said three-dimensional model is a part of or comprises a building information model (BIM).

BACKGROUND

In the art of general construction work such as building construction and civil engineering, planning, progress observation, documentation, appropriate accounting are important key factors. In many instances, those aspects are getting more and more complex and dynamic, in particular due to the many parties involved, fluctuating human and/or objective resources, increased complexity of the end results, tighter schedules, increased costs of human resources, etc. Work that was formerly planed and overseen by a single manager is nowadays too complex for a single person and a splitting between multiple people often miscarries at the thereby uprising interfaces.

Therefore, it has been tried to expand automation and computerization in this technical field. For example, in the art of building construction EP 2 629 210, JP 5489310, CN 103886139, US 2014/268064 or US 2014/192159 are giving examples of so called BIM-System approaches.

The technical problems therewith are multifarious. For example: Paper based orders might be outdated by the time they are issued to the executing entity; An immediate response to and purposeful handling of the unexpected is required, wherein all the consequences to a desired schedule have to be considered to minimize impact. Detecting, handling and documenting of the done work has to be established, deviations from a planed schedule have to be documented, determined and handled. Therein, the existing dependencies are often too complex to immediately cope with, in particular for an on-site executing entity.

In particular, in view of the desired flexible and efficient usage of executing entities, in view of the demand for increased efficiency and tight schedules, or often practiced real time replacement and spare management of structural and human resources, improvements going further than the standard human usage of computer and mobile phones are demanded. Also, the documentation demands are increased, e. g. by the project owner or principal, by the contractors or suppliers for proving flawlessness, by insurances, by government bodies, for settlement of damages, for handling compensation claims, to enforce due contractual penalties, for commissioning, etc.

SUMMARY

Some embodiments provide an improved construction management system for a building site of a structure. Other embodiments provide an improved method for linking data to a building information model.

Some embodiments provide such a system and method that allow a user to decide a proper reaction on an event more quickly.

A first aspect of the present invention relates to a construction management system for the construction of a structure, e. g. a building or piece of infrastructure. The construction management system comprises a plurality of sensor means adapted to detect events at a building site of the structure and a central computing unit, e. g. a server computer, providing a building information model comprising at least a three-dimensional model of the building site or of the structure, a construction plan comprising a target state of the construction of the structure, information about a current construction state of the structure, and information about participants in the construction of the structure, e. g. building companies and handicraft businesses. Furthermore the system comprises at least one displaying device, e. g. a personal computer or Smartphone, that is adapted to display the three-dimensional model to a user, e. g. a site manager.

According to this aspect of the invention, the plurality of sensor means is adapted for generating data comprising information about a detected event, and the system comprises a plurality of communication units adapted to transmit a message comprising the data and a location information to the central computing unit. Furthermore, the system is adapted to assign coordinates in the three-dimensional model according to the location information, the central computing unit has an evaluation algorithm adapted to evaluate options for reacting on the event by analyzing the data, thereby considering information from the building information model, and the system is adapted to assign evaluated options to the data. Moreover, for presenting the data, the at least one displaying device is adapted to display a note which is related to the data and to evaluated options to the user in real-time, wherein the note is displayed at the assigned coordinates in the three-dimensional model.

In one embodiment of the construction management system, the sensor means are adapted to generate the data automatically. In another embodiment, the communication units are adapted to generate the message automatically. Particularly, each of the plurality of sensor means comprises one of the plurality of communication units.

In a further embodiment of the construction management system, the sensor means are adapted as or comprise cameras, distance meters, motion detectors, smoke detectors, thermometers, hygrometers, and/or input means that are adapted to allow an input by an operator, the input means particularly comprising a keypad for inputting a code or text or a microphone for inputting a voice message.

According to another embodiment, the sensor means are adapted to generate the location information, particularly automatically, the location information comprising information about a location of the event, or of the sensor means detecting the event. In particular, the location information comprises either coordinates in a global or local coordinate system, particularly in a coordinate system of the building site, or a designator or code identifying a pre-defined position or area in the structure or at the building site, particularly a room of a building.

According to yet another embodiment, the central computing unit comprises at least one server computer. Particularly, the central computing unit comprises a cluster of server computers working as a cloud system. In this embodiment, the communication units are adapted to transmit the message to the central computing unit by means of an internet or intranet connection, and/or the at least one displaying device is adapted to receive the data from the central computing unit by means of an internet or intranet connection.

In one embodiment, the construction management system comprises a plurality of displaying devices, each of which being adapted to display the three-dimensional model with the note to a user in real-time, each user having a role in the construction of the structure. In this embodiment, the evaluation algorithm is adapted to evaluate, based on said roles, on which of the displaying devices a note is to be displayed, and/or the system is adapted to assign evaluated options to the data for each displaying device individually. In particular, displaying the three-dimensional model with the note comprises focussing on those notes which are of particular relevance for the role of the user to which the model is displayed. Said focussing may comprise e. g. a highlighting of the notes, a zooming to the note in the model, or an alignment of the view on the model so that the note is centred.

A second aspect of the present invention relates to a method for linking data to a building information model, particularly by means of a construction management system according to the first aspect. The data comprises information about an event occurring at a building site of a structure, and the building information model comprises at least a three-dimensional model of the building site or of the structure, a construction plan for the construction of the structure comprising a target state of the construction of the structure, information about a current construction state of the structure, and information about participants in the construction of the structure. The method comprises generating a message comprising the data and a location information;

transmitting the message to a central computing unit;

evaluating options for reacting on the event by analyzing the data, thereby considering information from the building information model, and assigning evaluated options to the data;

assigning coordinates in the three-dimensional model to the data according to the location information; and displaying the three-dimensional model to at least one user, wherein a note which is related to the data and to the assigned options is displayed in the three-dimensional model at the assigned coordinates in real-time.

According to one embodiment of the method, the data is generated automatically by sensor means detecting the event, particularly wherein the message is generated automatically by a communication unit of the sensor means, and the options are evaluated automatically by an evaluation algorithm of the central computing unit.

According to another embodiment, the location information comprises information about a location of the event, of a sensor means detecting the event, or of a communication unit generating the message. The location information particularly comprises coordinates in a global or local coordinate system, particularly in a coordinate system of the building site, or a designator or code identifying a predefined position or area in the structure or at the building site, particularly a room.

In one embodiment, the message comprises information about a time of the event or of the detection of the event, wherein for evaluating options for reacting also the information about the time are considered, and/or the note is based also on the information about the time.

According to a further embodiment, the three-dimensional model is displayed simultaneously to a plurality of users on a plurality of displaying devices, each user having a role in the construction of the structure, wherein each of the displaying devices receives the data from the central computing unit, particularly by means of an internet or intranet connection, the central computing unit comprising at least one server computer, particularly a cluster of server computers working as a cloud system. In this embodiment, the method comprises evaluating, based on the roles, on which of the displaying devices a note is to be displayed, and/or assigning evaluated options to the data for each displaying device individually. In particular, displaying the three-dimensional model with the note comprises focusing on those notes which are of particular relevance for the role of the user to which the model is displayed.

In one embodiment of the method, displaying the note in the three-dimensional model comprises presenting the data and evaluated options to the user.

In another embodiment, displaying the note in the three-dimensional model comprises visualizing an icon at the assigned coordinates in real-time, wherein the icon is user-selectable, and upon a user-selection of the icon a notice is visualized based on the message. In particular, together with visualizing the icon, a notification sound signal is played, the sound signal depending on a kind of the data, particularly on the kind of detected event;

the icon is assigned a design according to a kind of the data or of the message and visualized with the assigned design;

the user-selection of the icon comprises pointing a mouse cursor on the icon, or touching a touchpad;

evaluating options for reacting on the event comprises selecting recommended options for reacting on the event, and the visualizing the notice comprises presenting at least one recommended option to the user; and/or the notice is visualized at the assigned coordinates.

According to one embodiment, the data comprises picture data and/or audio data, particularly wherein displaying the note comprises displaying an image based on the picture data;

the data comprises video data, and a video based on the video data is displayed upon user-selection of the respective note; and/or generating the message comprises recording a voice message or a video message by an operator, the voice or video message being replayed by the display unit upon user-selection of the respective note.

A third aspect of the invention relates to a computer programme product comprising programme code which is stored on a machine-readable medium, or being embodied by an electromagnetic wave comprising a programme code segment, and having computer-executable instructions for performing, in particular when run on calculation means of a construction management system according to the first aspect of the invention, at least the following steps of the method according to the second aspect:

evaluating options for reacting on the event by analyzing the data, thereby considering information from the building information model, and assigning evaluated options to the data;

assigning coordinates in the three-dimensional model to the data according to the location information; and displaying the three-dimensional model, wherein a note which is related to the data and to the assigned options is displayed in the three-dimensional model at the assigned coordinates in real-time.

BRIEF DESCRIPTION OF THE DRAWINGS

The invention in the following will be described in detail by referring to exemplary embodiments that are accompanied by figures, in which:

FIG. 3 illustrates a first exemplary event detection and the sending of a message comprising event data to a server computer;

DETAILED DESCRIPTION

Figure 1:
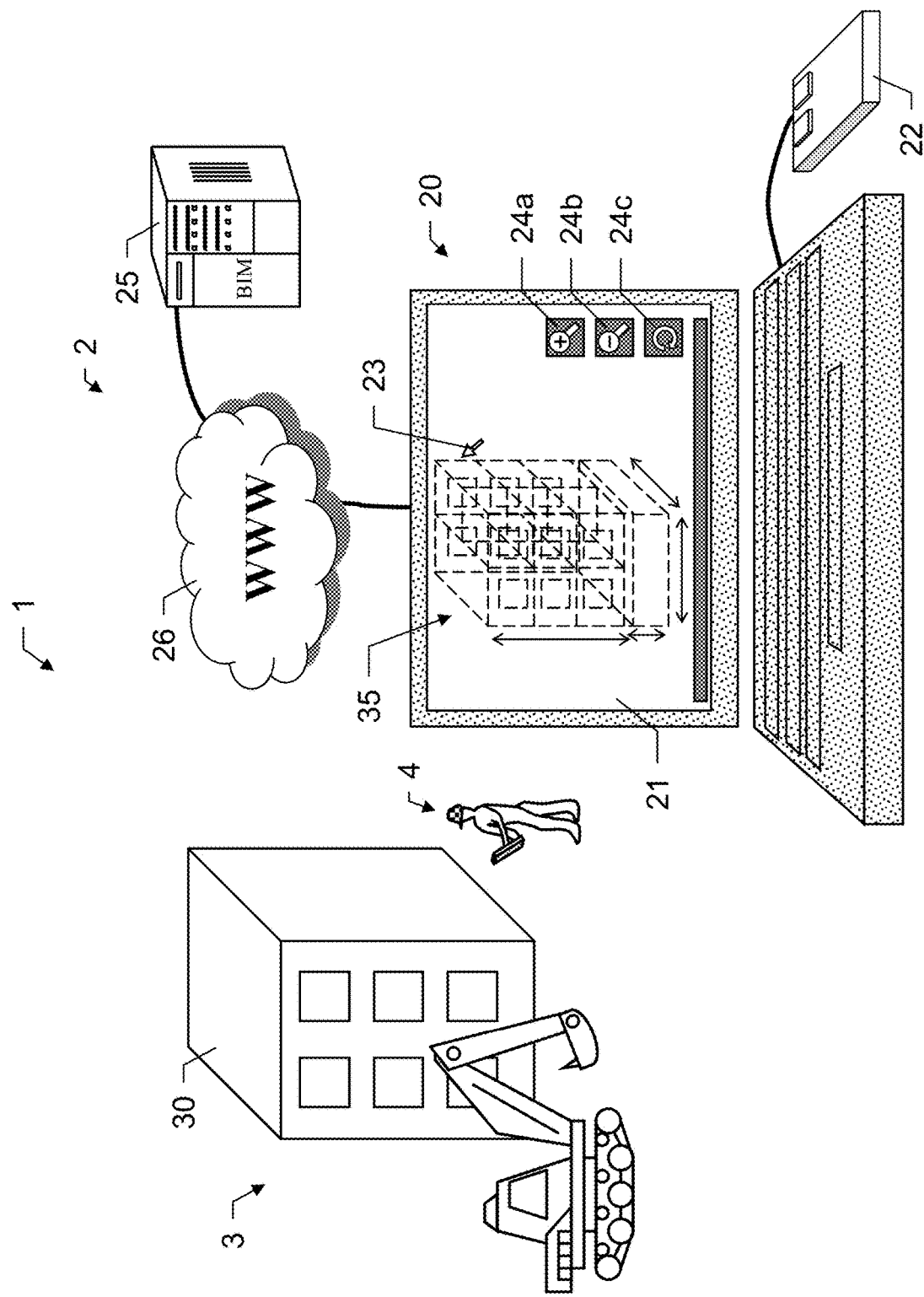
FIG. 1 shows the components of an exemplary embodiment of a construction management system according to the invention.

In FIG. 1 an exemplary embodiment of a construction management system 1 according to the invention is depicted. The system comprises a computer system 2 comprising one or more display units 20 and a server computer 25 that are connected by means of an internet connection 26. In the shown example, the display unit 20 is a laptop comprising a display 21 (output means) and a mouse 22 (input means). On the display 21 a graphical user interface (GUI) is displayed with a mouse cursor 23 and several buttons 24a-c. In the GUI, a three-dimensional model 35 of a building 30 is visualized. A user (not shown) of the laptop is enabled to change the view on the model 35 by moving the cursor 23 on one of the GUI buttons 24a-c and clicking on a button of the mouse 22 (e. g. rotate the model, zoom in or out).

The system furthermore comprises at least one sensor unit (not shown) that is located at a building site 3 of the building 30 that is represented by the three-dimensional model 35. The sensor unit can be installed in the building 30 to work autonomously or be operated by an operator 4 at the building site.

The user of the display unit 20 has a certain role with respect to the construction, for instance is a site manager of the building site 3.

Instead of a building, the construction can of course also be or comprise infrastructure such as roads or railways. Further, instead of a single server computer 25, a cluster of servers, a cloud or similar means can be used.

Figure 2:
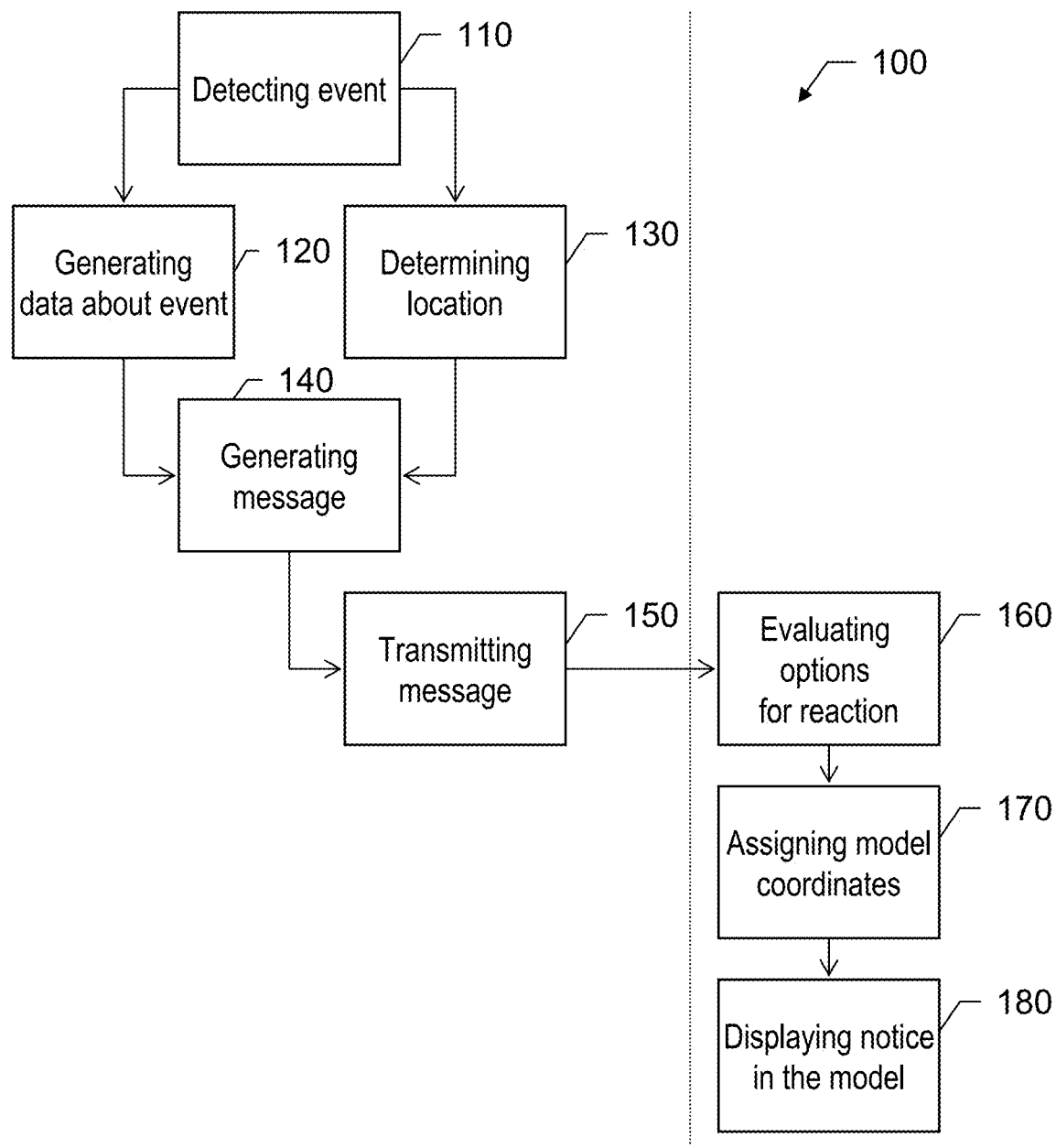
FIG. 2 illustrates an exemplary embodiment of a method for linking data comprising information about an event to a three-dimensional model.

FIG. 2 is a flow chart illustrating a method 100 according to the invention for linking data comprising information about an event taking place at the building site to the three-dimensional model. The dotted line represents a virtual border between those method steps on the left of the line which take place at the building site 3 and those on the right taking place in the computer system 2 (see FIG. 1).

The method 100 begins with detection 110 of an event. The event is detected by some kind of sensor unit at the building site. A multitude of sensor means and detectable events that occur on a building site are thinkable. For instance, the sensor units may comprise thermometers and hygrometers for detecting a temperature and wetness in a certain room of the construction, highly precise distance meters for detecting unwanted movement of the construction, motion detectors and cameras for detecting work progress or unauthorized persons, or smoke detectors for detecting fire. The sensor units can also comprise input means to allow input by an operator of the units. E. g. these comprise a keypad for inputting a code or text, a microphone for recording a voice message or a camera for recording a video message. This user input is then the event detected by the unit.

When the event is detected, in step 120 data is generated, particularly automatically by the sensor unit. For example, this data may comprise measured values, the information that a pre-defined threshold has been reached, video data, or the user input.

Furthermore, in step 130 a location is determined. Depending on the kind of sensor, this location can either be that of the sensor unit itself or that of the determined event. Alternatively, an operator can input the exact location of the event. The location can be either a set of coordinates or a code for a certain room or area.

Next, a message is generated in step 140. This message comprises at least the data from step 120 and the location information of step 130. Also, a time information can be added automatically.

In step 150, the message is transmitted via an internet or intranet connection to a computer, e. g. a remote server computer, having memory on which a model of the building site or structure is stored. To do so, the sensor units can comprise or be connected to a suitable communication means which sends the message by cable or wireless, e. g. by means of Bluetooth, WiFi, or a mobile communications network. Optionally, before transmitting the message, the data can be encoded or compressed.

The message is received by the remote server computer (right side of the flow chart). If necessary, the data is decoded or decompressed.

In step 160, the data received with the message is analyzed by an algorithm of the computer with respect to whether a reaction to the event is necessary. The algorithm takes into account available data from the BIM database, i.e. a construction plan, comprising a target state of the construction of the structure at the building site, information about a current construction state of the structure (as-built) and information about participating parties in the construction of the structure. Based on this information, it is evaluated whether the event has an impact on the construction and to what extent. If necessary, options for reacting on the event are evaluated by the algorithm, and, if applicable, recommended options for reacting on the event are selected and assigned to the data.

In step 170, the location information is read out, and the message (or its data, respectively) is assigned a corresponding set of coordinates in the three-dimensional model.

The data is send to a display unit, on which the three-dimensional model is displayed. According to the assigned coordinates, in step 170 a notice is displayed in the model at the location of the event, comprising the data from the message. Due to the visualization of the notice at the position of the model that corresponds to the location of the event and due to the enclosed automatically generated recommendations, a user is enabled to grasp the context of the presented data and to decide how to react more quickly.

FIG. 3 illustrates the detection of an event at the building site 3 and the transmission of a message comprising data about the event to a remote server computer 25.

In the building site 3 of the structure 30 an operator 4 of a mobile device 41 is situated in a room 31 of the structure. The mobile device 41 comprises input means, such as a keypad or a touchscreen. The operator 4, e. g. a construction worker or a craftsman, using the input means of the mobile device 41, writes a text or enters other data. This text or other data may e. g. be related to his work progress, to measuring results, to missing parts, or other observations related to this room 31.

The mobile device 41 is equipped with means for determining its position on the building site 3 and with means for determining a time. The device 41 generates a message 50 comprising the text or other data, a location information, e. g. a set of coordinates, and a time information.

The mobile device 41 furthermore comprises communication means adapted to transmit the message to a remote server computer 25 by means of a wireless data connection 27. Although a direct data connection 27 is shown here, the connection to the server 25 can of course also be indirect, e. g. via the internet 26 or a mobile communications network. The message 50 then for instance could be send as an email or SMS text. The server 25 can be connected to one or more display units (not shown here) via the internet 26.

Figure 4A:
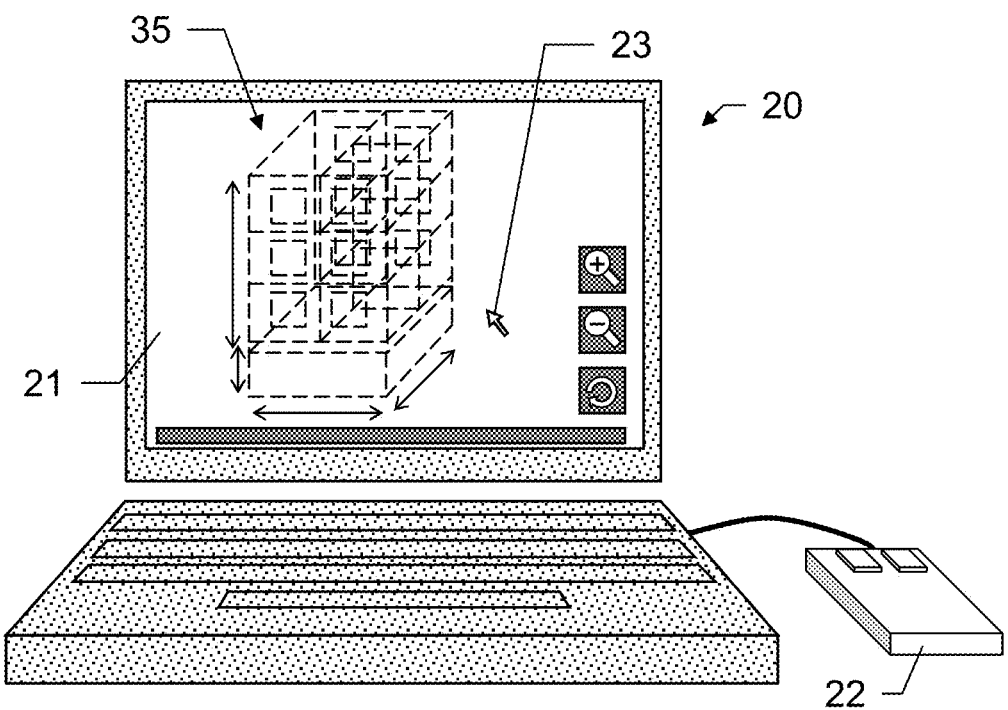
FIGS. 4a-d illustrate the visualization of the data in the three-dimensional model.

In FIGS. 4a-d, a visualization of the data of FIG. 3 in a three-dimensional model 35 is illustrated. FIG. 4a shows the laptop 20 of FIG. 1 having a display 21 and a mouse 22. Shown is the GUI with the three-dimensional model 35 before the transmission of the message containing the data.

Figure 4B:
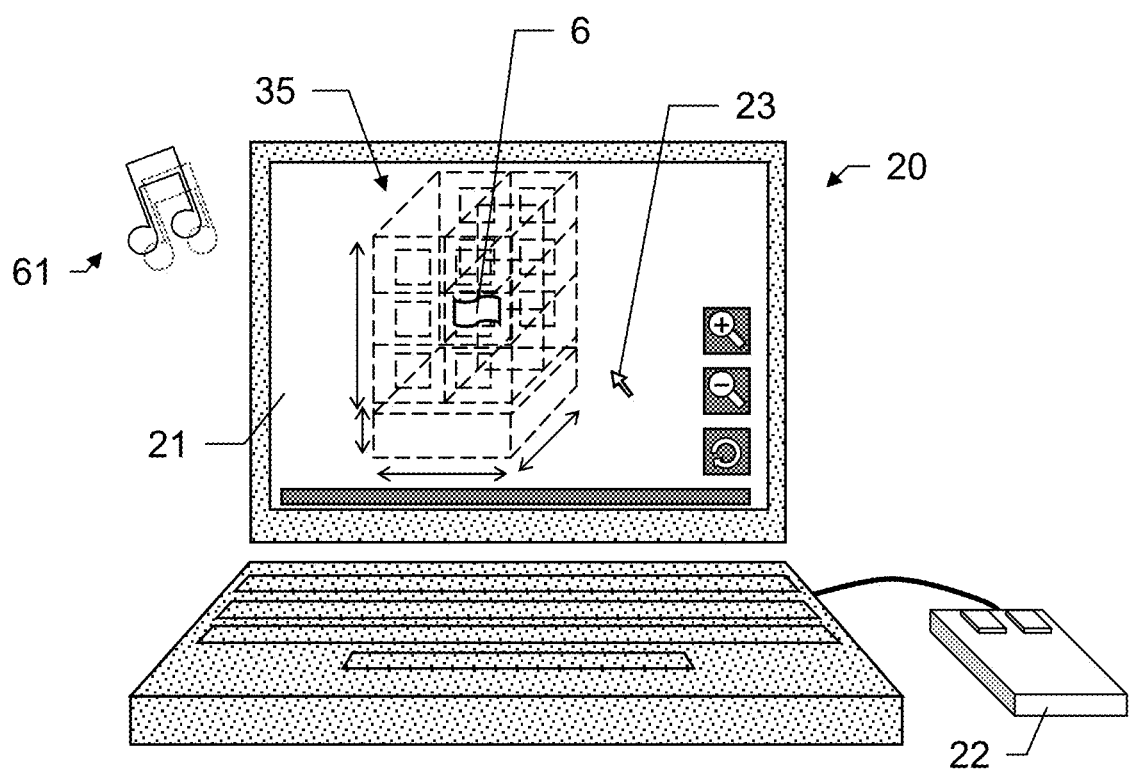

In FIG. 4b, the transmitted data which has been assigned a set of coordinates in the three-dimensional model 35 according to the location information with respect to the building site is received by the laptop 20. This results in the visualization of an icon 6 on the display 21. According to the invention, the icon 6 is automatically displayed at the correct position in the model 35. In this case it pops up at the position of the room of FIG. 3 where the message was generated. Together with the visualization of the icon 6, a notification signal 61 can sound, to let the user know that a new message has arrived.

Figure 4C:
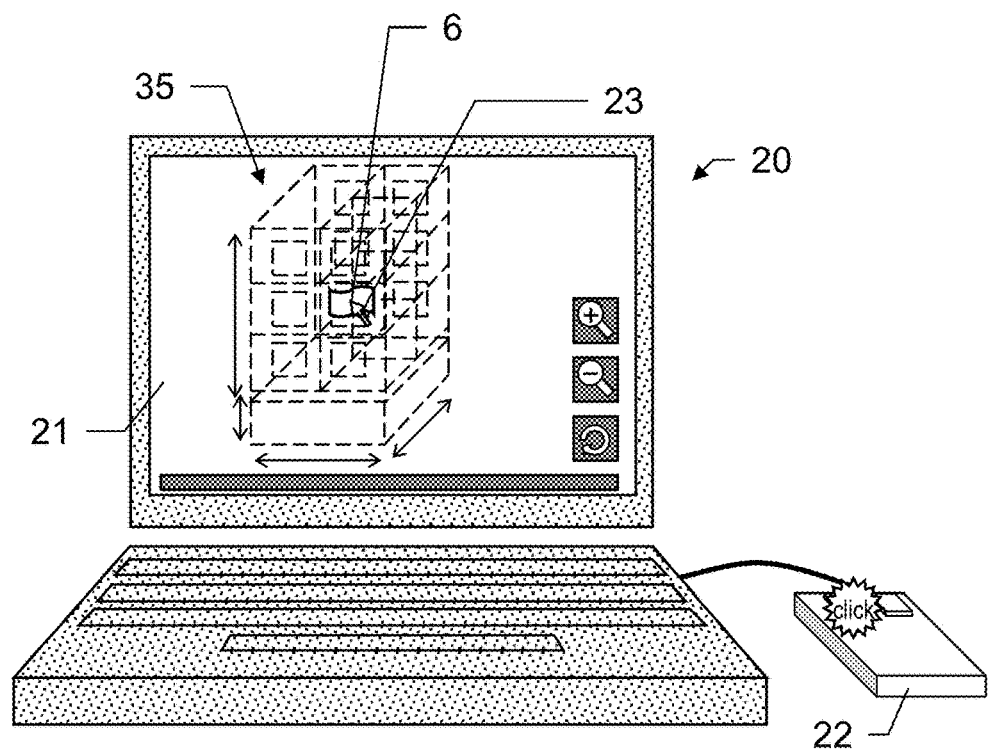
Figure 4D:
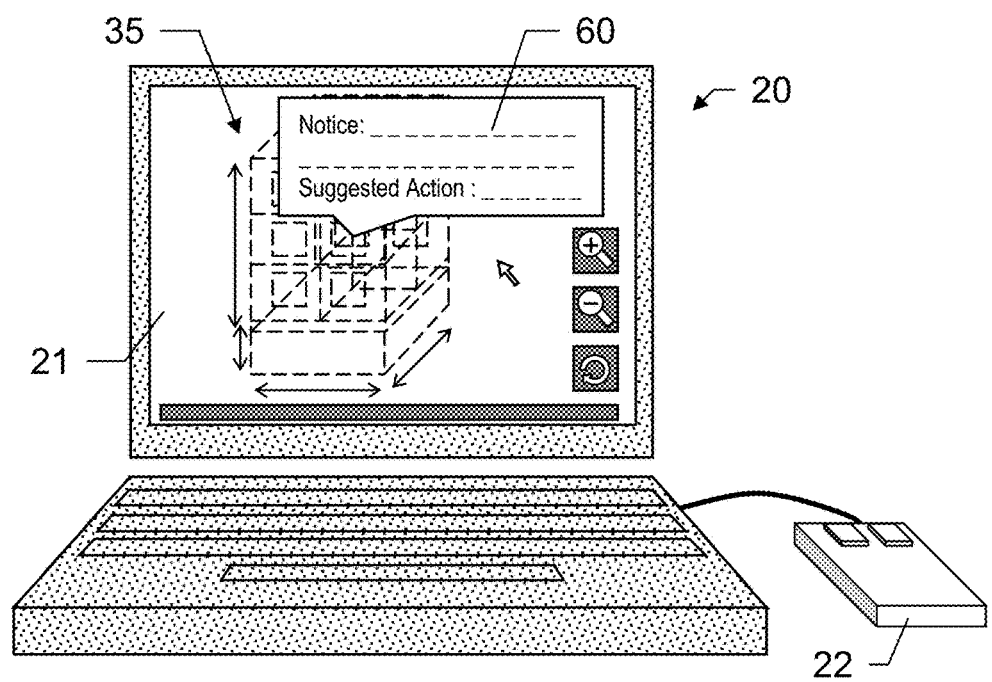

In FIG. 4c, the user has moved the mouse cursor 23 onto the icon 6 and clicks the button of the mouse 22 to select the message. As shown in FIG. 4d, this opens a notice window 60 comprising the data of the message and recommendations for proceeding. Optionally, the recommendations section can comprise shortcut links.

The icon 6 e. g. can be a miniature version of the notice 60 or a symbol coloured according to a kind of event or priority of reaction. The icon 6 can be visualized as a two- or three-dimensional object in the three-dimensional model 35. Optionally, the icon 6 and or the notice 60 can be displayed semi-transparent in order not to hide the model 35.

The following Figures each show examples of sensor units at the building site, the sensor units generating and transmitting messages that can be visualized in a three-dimensional model of the building site.

Figure 5:
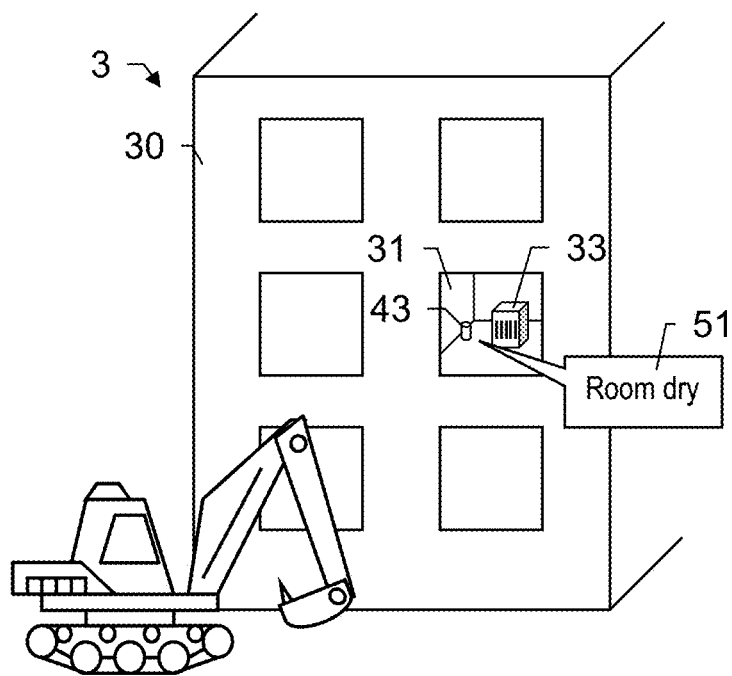
FIG. 5 shows a second exemplary event detection by means of hygrometer.

In FIG. 5, a hygrometer unit 43 is positioned in a room 31 of the building 30. A dehydrator 33 has been placed in this room to reduce the humidity in this room. As soon as the room is dry enough, i.e. the humidity falls below a certain threshold, work can continue. The hygrometer unit 43 is thus programmed to send a message as soon as a pre-defined humidity level is reached. The generated message 51 that the room is dry enough to continue work is sent together with the location information (e. g. a room number) to the central computer unit (not shown here).

Figure 6:
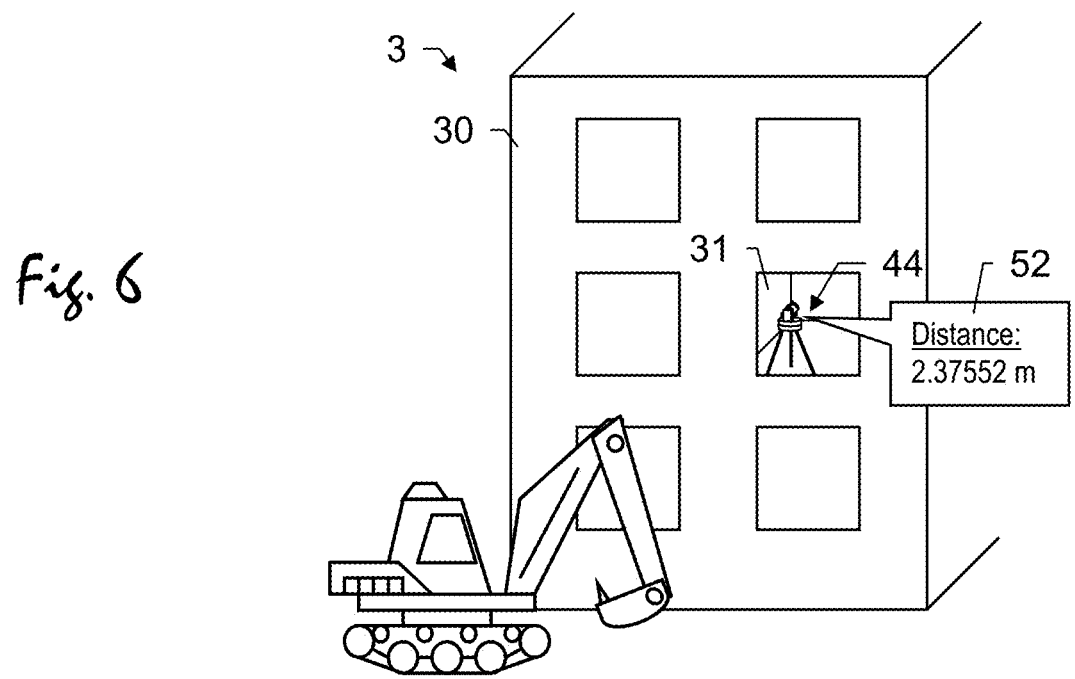
FIG. 6 shows a third exemplary event detection by means of an autonomous distance meter.

In the example of FIG. 6, a geodetic measuring device 44 is positioned in the room 31 and continuously measures a distance to a distant wall with high precision in order to determine a stability of the structure 30. In pre-determined intervals, a message 52 is generated and transmitted automatically, the message 52 comprising one or more measured values, the exact time and the coordinates of the device 44 in a local coordinate system.

Figure 7:
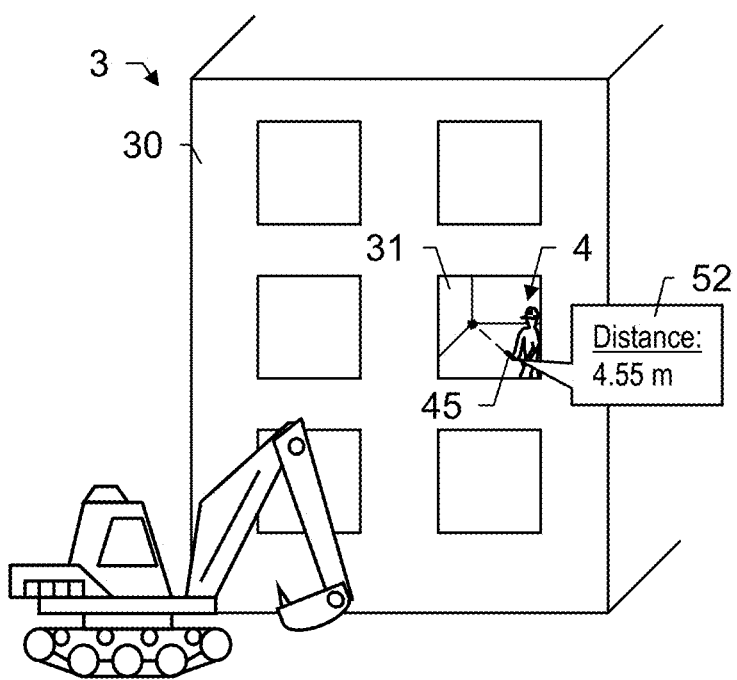
FIG. 7 shows a fourth exemplary event detection by means of a hand-held distance meter.

In the example of FIG. 7, an operator 4 operates a hand-held laser-based distance measuring device 45 for measuring distances between points in the room 31, e. g. between corner points. After the measurements, the operator 4 initiates a generation and transmission of a message 52 by the device 45, the message comprising the relevant results and either coordinates determined by the device or a room number entered by the operator 4.

Figure 8:
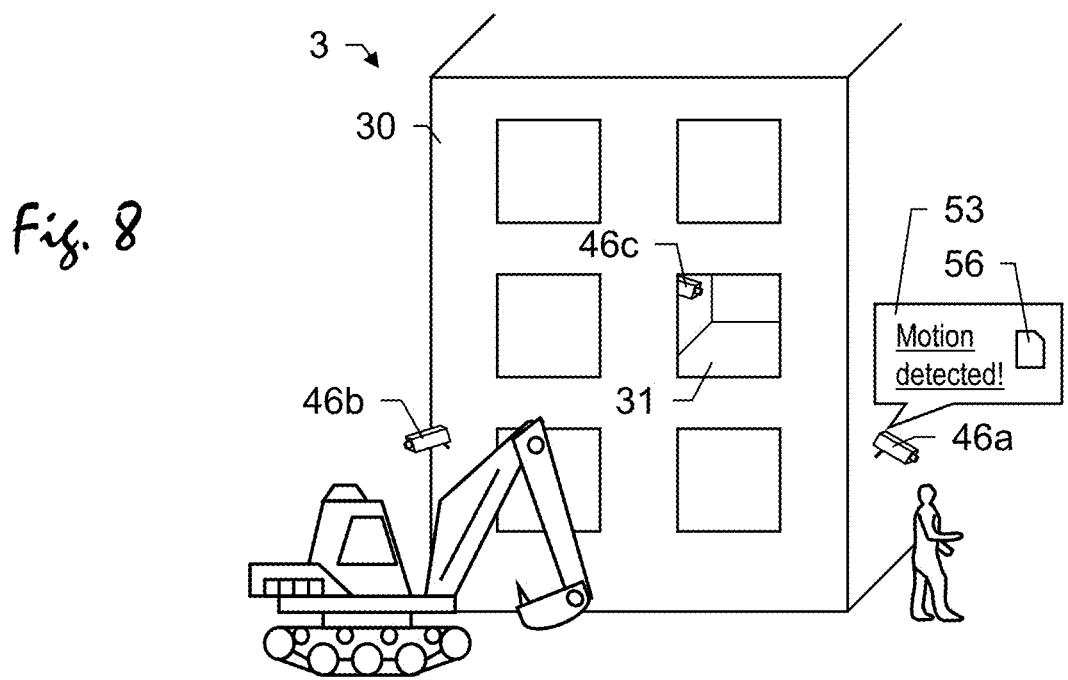
FIG. 8 shows a fifth exemplary event detection by means of cameras and motion sensors.

In the example of FIG. 8, a multitude of camera units 46a, 46b, 46c is positioned on the building site 3, each of which comprising a motion sensor and a surveillance camera.

Here, camera unit 46a detects a motion and starts recording a video. A message 53 is generated comprising a file 56 with the video data and transmitted to the server. Then, as shown in FIG. 4b, on a display an icon can be visualized in the three-dimensional model of the building site 3 at model coordinates corresponding to the real-world position of the camera unit 46a at the building site 3. When the icon is selected by the user, the video is replayed on the display.

Alternatively or additionally, each camera unit 46a, 46b, 46c can generate and transmit a message in pre-defined intervals, comprising an image taken by the surveillance camera. The images can be visualized in real-time in the three-dimensional model at model coordinates corresponding to the real-world positions of the respective camera unit 46a, 46b, 46c at the building site 3.

Figure 9:
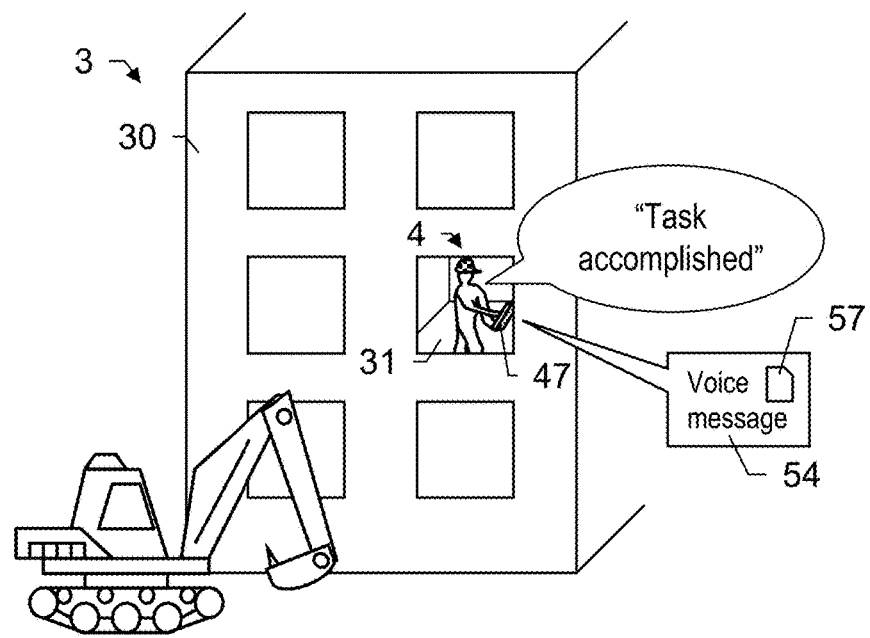
FIG. 9 shows a sixth exemplary event detection by means of a user input device having a microphone for recording a voice message.

In the example of FIG. 9, an operator 4 operates a hand-held sensor unit 47 comprising a microphone, which is adapted to record and transmit voice messages to the server computer. The operator 4, being situated at a room 31 of the building 30, speaks his observation or report into the microphone. For instance, the operator could report occurring problems such as lack of or defective material, bad preparatory work, or other unexpected conditions. In this example, the operator 4 simply reports that his task in the room 31 has been accomplished. The sensor unit 47 generates a message 54 comprising an audio file 57 and transmits this message 54 to the remote computer.

Alternatively, the spoken words of the audio file can be translated into a text which is transmitted to the remote computer, or the translation is performed at the remote computer.

Figure 10:
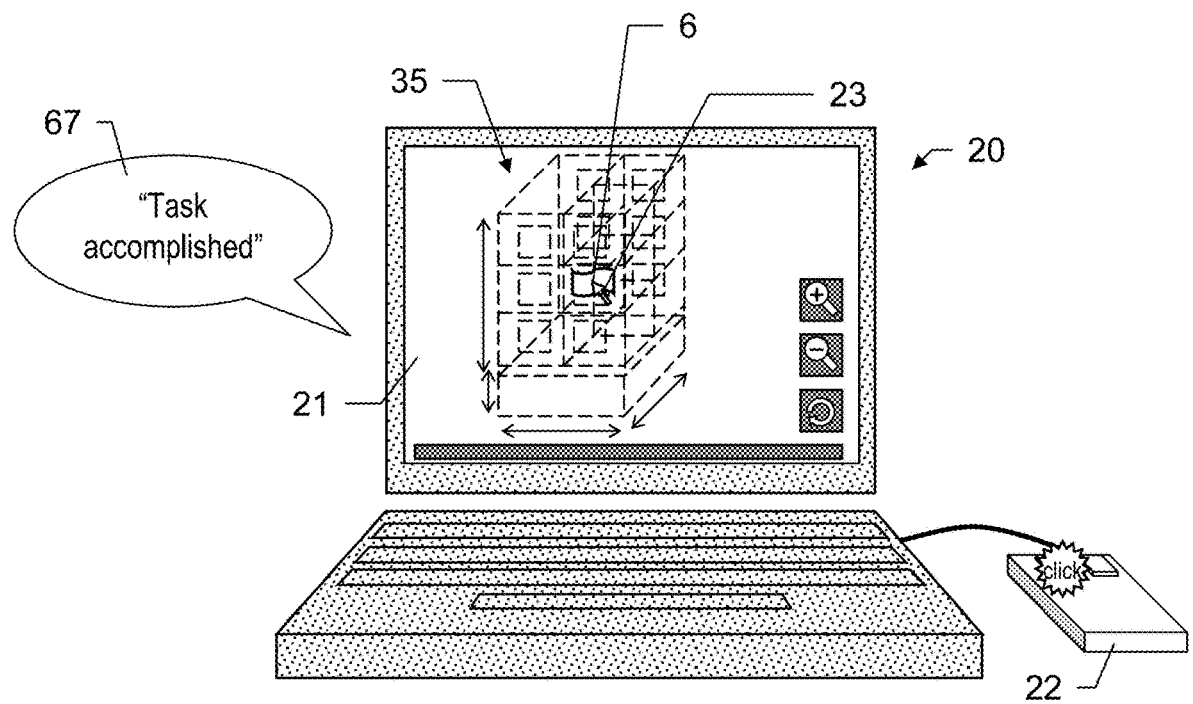
FIG. 10 illustrates the visualization and replay of a voice message.

FIG. 10 illustrates the output of the recorded message of FIG. 9 to the user. The three-dimensional model 35 of the structure is displayed on the display 21 of the laptop 20. An icon 6 pops up at the correct position in the three-dimensional model 35. By clicking on the icon 6 with the mouse cursor 23, the audio file with the recorded voice message 67 is played by a speaker system of the laptop 20.

Optionally, e. g. if the task has been accomplished earlier as expected, also a window with recommendations could open on the display 21 (as shown with respect to FIG. 4d), e. g. suggesting advancing other works at that room.

Figure 11:
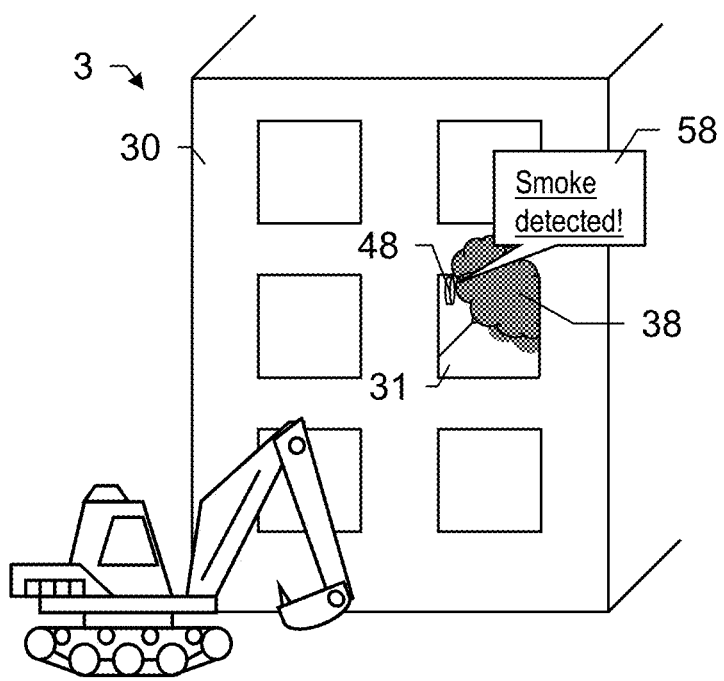
FIG. 11 shows a seventh exemplary event detection by means of a smoke detector.
Figure 12:
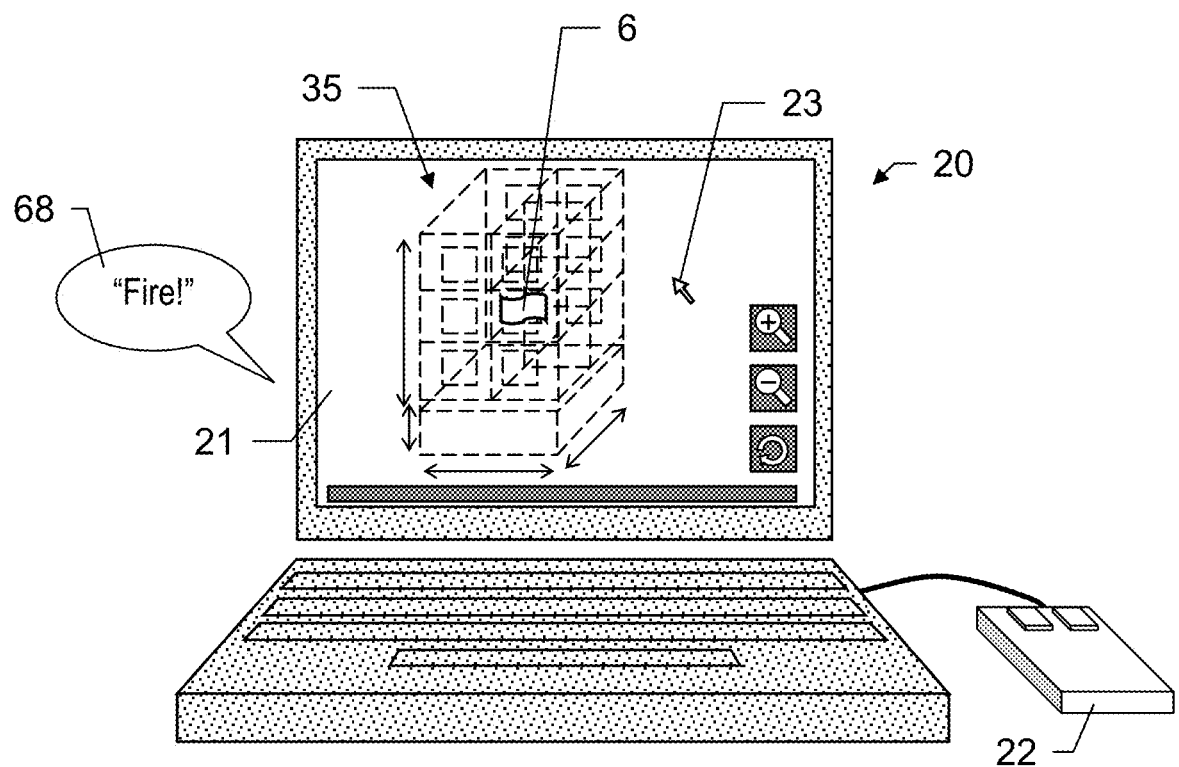
FIG. 12 illustrates the visualization of a fire alert.

In the example of FIG. 11, a smoke detector 48 is located in a room 31 of the building 30 to be constructed on the building site 3. If this smoke detector 48 detects smoke 38, a message 58 is generated and transmitted to a remote server computer. In FIG. 12 the output to the user is illustrated. As in the analysis of the event data the message has been evaluated to be urgent, together with the visualization of the icon 6 in the model 35 at the location of the smoke detector, a fire alert signal 68 is sounded without the user having to click the icon 6.

Figure 13:
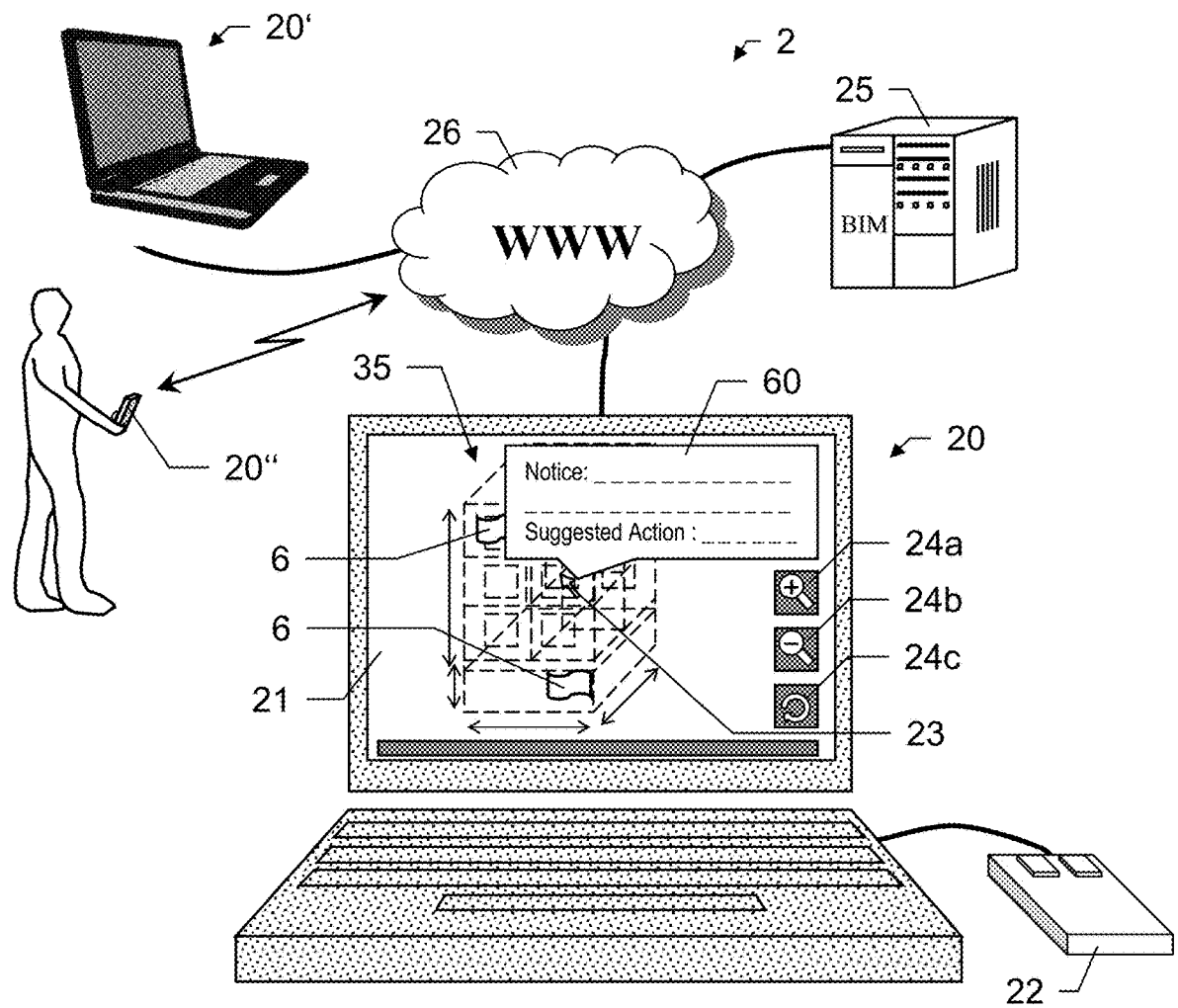
FIG. 13 illustrates an exemplary embodiment of a construction management system having a plurality of display units.

FIG. 13 shows a computer system 2 of another exemplary embodiment of the construction management system, the computer system 2 comprising a server computer 25 on which a building information model (BIM) is provided. In this embodiment, the computer system 2 comprises a plurality of display devices 20, 20', 20". These are connected to the server computer 25 via the internet 26. On the display 21 a three-dimensional model 35 of a building to be constructed is presented, wherein a plurality of icons 6 are displayed at model coordinates corresponding to the locations of events occurred at a construction site of the building. One of the icons has been selected by the user by clicking on it with the mouse cursor, so that a notice 60 comprising information about the event is displayed. The notice optionally also comprises recommended options for reacting to the event.

As a multitude of persons can have access to the BIM, the three-dimensional model 35 of the structure can be displayed on a plurality of devices 20, 20', 20" simultaneously. These devices comprise desktop computers, laptops and hand-held devices such as tablet computers or Smartphones. All these devices are connected to a central server computer 25, for instance by means of the internet.

Each user can have a certain role assigned. For instance, the users of the BIM can be site managers of the building site, architects of the building, the owner of the building, building project organisers, sub-contractors, site foremen and official construction inspectors.

The evaluation algorithm of the central server computer 25 is preferably adapted to evaluate which user, user group or role needs to know about which event, and thus to which of the devices 20, 20', 20" the data is provided. Furthermore, the evaluation algorithm can be adapted to evaluate options for reacting on the event for each user, user group or role individually, so that data about the same event can be provided with different assigned options to each of the devices 20, 20', 20".

The system can be setup to work offline and only be synchronized on the devices 20, 20', 20" when these are online. This applies particularly to mobile devices. Optionally, new notices can also be sent as push-up notices to mobile devices.

Optionally, all detected events and generated messages can be logged and stored on a server or in a cloud until the end of the construction project or even longer, e. g. for conservation of evidence.

Although the invention is illustrated above, partly with reference to some preferred embodiments, it must be understood that numerous modifications and combinations of different features of the embodiments can be made. All of these modifications lie within the scope of the appended claims.

What is claimed is:

1. A construction management system for the construction of a structure, the system comprising:
a plurality of sensor means adapted to detect events at a building site of the structure and to generate data comprising information about a detected event,
a central computing unit providing a building information model comprising:
a three-dimensional model of the building site or of the structure,
a construction plan comprising a target state of the construction of the structure,
information about a current construction state of the structure, and
information about participants in the construction of the structure;
at least one displaying device that is adapted to display the three-dimensional model to a user; and
a plurality of communication units adapted to transmit a message comprising the data and a location information to the central computing unit,
wherein:
the construction management system is configured to assign coordinates in the three-dimensional model according to the location information,
the central computing unit has an evaluation algorithm adapted to evaluate options for reacting on the event by analyzing the data using information from the building information model,
the system is adapted to assign evaluated options to the data, and
the at least one displaying device is adapted to display a note related to the data and to evaluated options to the user in real-time, wherein the note is displayed at the assigned coordinates in the three-dimensional model.

2. The construction management system according to claim 1, wherein the sensor means are adapted to generate the data automatically, or the communication units are adapted to generate the message automatically.

3. The construction management system according to claim 1, wherein the sensor means comprises at least one of:
a camera,
a distance meter,
a motion detector,
a smoke detector,
a thermometers,
a hygrometer, or
an input means configured to allow an input by an operator.

4. The construction management system according to claim 1, wherein the sensor means are configured to generate the location information comprising information about a location of the event.

5. The construction management system according to claim 1, wherein the central computing unit comprises at least one server computer, wherein the communication units are adapted to transmit the message to the central computing unit by means of an internet connection, and wherein the at least one displaying device is adapted to receive the data from the central computing unit by means of an intranet connection.

6. The construction management system according to claim 1, further comprising a plurality of displaying devices each being configured to display the three-dimensional model with the note to a user in real-time, each user having a role in the construction of the structure, wherein the evaluation algorithm is adapted to evaluate, based on the roles, on which of the displaying devices a note is to be displayed, and the system is adapted to assign evaluated options to the data for each displaying device.

7. A method for linking data to a building information model, wherein the data comprises information about an event occurring at a building site of a structure and the building information model comprises at least a three-dimensional model of the building site or of the structure, a construction plan for the construction of the structure comprising a target state of the construction of the structure, information about a current construction state of the structure, and information about participants in the construction of the structure, the method comprising:

generating a message comprising the data and a location information;

transmitting the message to a central computing unit comprising at least one server computer;

evaluating options for reacting on the event by analysing the data using information from the building information model, and assigning evaluated options to the data;

assigning coordinates in the three-dimensional model to the data according to the location information;

providing the data from the central computing unit to at least a subset of the displaying devices; and displaying the three-dimensional model simultaneously to a plurality of users on a plurality of displaying devices, each user having a role in the construction of the structure, wherein a note which is related to the data and to the assigned options is displayed in the three-dimensional model at the assigned coordinates in real-time, wherein the options for reacting are assigned to the data for each displaying device individually and it is evaluated, based on the roles, on which of the displaying devices a note is to be displayed.

8. The method according to claim 7, wherein the data is generated automatically by a sensor means detecting the event, and the options are evaluated automatically by an evaluation algorithm of the central computing unit.

9. The method according to claim 7, wherein the location information comprises information about a location of the event, a sensor means detecting the event, or a communication unit generating the message.

10. A method according to claim 7, wherein the message comprises information about a time of the event or of the detection of the event, wherein information about the time are considered in evaluating options for reacting, and wherein the note is also based on the information about the time.

11. A method according to claim 7, wherein displaying the note in the three-dimensional model comprises presenting the data and evaluated options to the user.

12. The method according to claim 7, wherein displaying the note in the three-dimensional model comprises visualizing an icon at the assigned coordinates in real-time, wherein the icon is user-selectable, and upon a user-selection of the icon, a notice is visualized based on the message.

13. The method according to claim 7, wherein the data comprises picture data and/or audio data.

14. A computer program product comprising programmable code which is stored on a machine-readable medium, and having computer-executable instructions for performing, at least the following steps of the method of claim 7:

evaluating options for reacting on the event by analysing the data, using information from the building information model, and assigning evaluated options to the data;

assigning coordinates in the three-dimensional model to the data according to the location information;

providing the data from the central computing unit to at least a subset of the displaying devices; and displaying the three-dimensional model simultaneously to a plurality of users on a plurality of displaying devices, each user having a role in the construction of the structure, wherein a note which is related to the data and to the assigned options is displayed in the three-dimensional model at the assigned coordinates in real-time, wherein the options for reacting are assigned to the data for each displaying device individually and it is evaluated, based on the roles, on which of the displaying devices a note is to be displayed.

* * * * *